United States Patent
Vellianitis

(10) Patent No.: US 11,411,089 B2
(45) Date of Patent: Aug. 9, 2022

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventor: Georgios Vellianitis, Heverlee (BE)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 17/111,466

(22) Filed: Dec. 3, 2020

(65) Prior Publication Data

US 2021/0391430 A1 Dec. 16, 2021

Related U.S. Application Data

(60) Provisional application No. 63/038,913, filed on Jun. 15, 2020.

(51) Int. Cl.
| | |
|---|---|
| *H01L 29/417* | (2006.01) |
| *H01L 29/40* | (2006.01) |
| *H01L 29/423* | (2006.01) |
| *H01L 29/78* | (2006.01) |
| *H01L 29/08* | (2006.01) |
| *H01L 29/10* | (2006.01) |

(52) U.S. Cl.
CPC .... *H01L 29/41775* (2013.01); *H01L 29/0865* (2013.01); *H01L 29/1033* (2013.01); *H01L 29/401* (2013.01); *H01L 29/4232* (2013.01); *H01L 29/4236* (2013.01); *H01L 29/785* (2013.01); *H01L 29/7813* (2013.01)

(58) Field of Classification Search
CPC ........... H01L 29/41775; H01L 29/4236; H01L 29/785; H01L 29/1033; H01L 29/0865; H01L 29/4232; H01L 29/7813
See application file for complete search history.

(56) References Cited

U.S. PATENT DOCUMENTS

2020/0105527 A1* 4/2020 Vellianitis ........... H01L 27/1211
2021/0118883 A1* 4/2021 Lim ...................... H01L 27/092

* cited by examiner

*Primary Examiner* — Joseph C. Nicely
(74) *Attorney, Agent, or Firm* — JCIPRNET

(57) ABSTRACT

A semiconductor device and a manufacturing method thereof are provided. The gate structure and the source and drain terminals are located in the insulating dielectric layer, and the source and drain terminals are located respectively at both opposite ends of the gate structure. The channel region is sandwiched between the gate structure and the source and drain terminals and surrounds the gate structure. The channel region extends between the source and drain terminals.

20 Claims, 14 Drawing Sheets

SEMICONDUCTOR DEVICE AND MANUFACTURING METHOD THEREOF

CROSS-REFERENCE TO RELATED APPLICATION

This application claims the priority benefit of U.S. provisional application Ser. No. 63/038,913, filed on Jun. 15, 2020. The entirety of the above-mentioned patent application is hereby incorporated by reference herein and made a part of this specification.

BACKGROUND

Continuing developments in the fabrication of semiconductor devices and electronic components make the integration of various semiconductor devices and electronic components possible.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
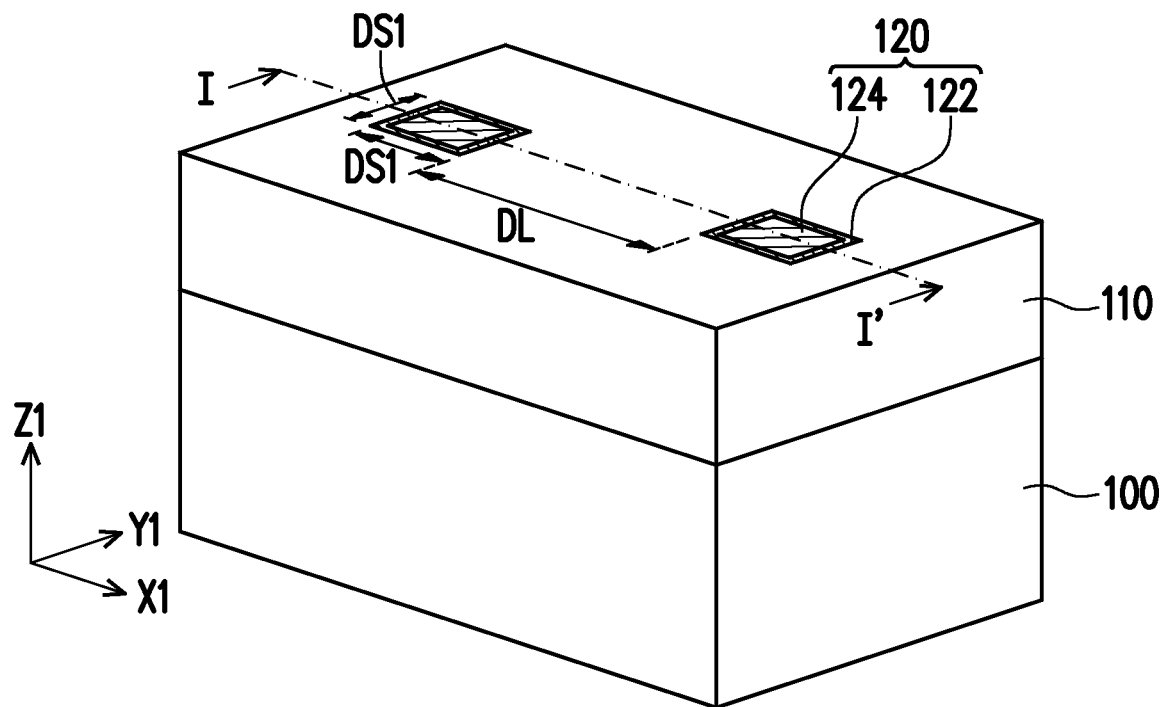
FIG. 1A to FIG. 4B are schematic three-dimensional (3D) views and cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and other semiconductor devices. The substrates and/or wafers may include one or more types of integrated circuits or electronic components therein. The semiconductor device(s) may be formed on a bulk semiconductor substrate or a silicon/germanium-on-insulator substrate. The semiconductor device(s) may be formed on a dielectric substrate or a ceramic/glass substrate. The embodiments are intended to provide further explanations but are not used to limit the scope of the present disclosure.

FIG. 1A to FIG. 4B are schematic three-dimensional (3D) views and cross-sectional views of various stages in a manufacturing method of a semiconductor device in accordance with some embodiments of the disclosure. FIG. 1B, FIG. 2B, FIG. 3B and FIG. 4B are schematic cross-sectional views along the sectional lines I-I' of FIG. 1A, FIG. 2A, FIG. 3A and FIG. 4A respectively.

Figure 1B:
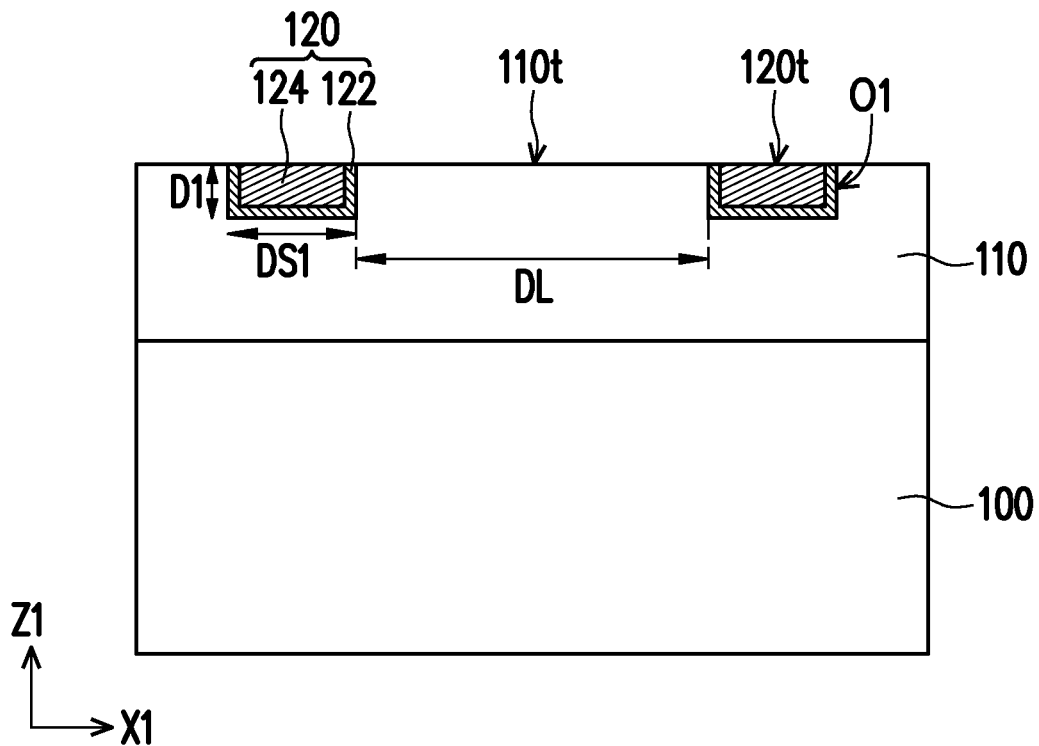

Referring to FIG. 1A and FIG. 1B, in some embodiments, a substrate 100 having an insulating dielectric layer 110 is provided. In some embodiments, the substrate 100 may include a semiconductor substrate. In one embodiment, the substrate 100 comprises a crystalline silicon substrate or a doped semiconductor substrate (e.g., p-type semiconductor substrate or n-type semiconductor substrate). In certain embodiments, the substrate 100 comprises one or more doped regions or various types of doped regions, depending on design requirements. In some embodiments, the doped regions are doped with p-type and/or n-type dopants. In some alternative embodiments, the substrate 100 includes a semiconductor substrate made of other suitable elemental semiconductor, such as diamond or germanium; a suitable compound semiconductor material such as gallium arsenide (GaAs), indium arsenide, aluminum nitride (AlN), gallium nitride (GaN), silicon carbide (SiC), or indium phosphide (InP), and alloy semiconductor materials such as silicon germanium, silicon germanium carbide, gallium arsenide phosphide, gallium indium phosphide, aluminum gallium arsenide, aluminum indium arsenide, or aluminum gallium indium phosphide. In some embodiments, the substrate 100 includes one or more active component such as transistors, diodes, optoelectronic devices and/or one or more passive components such as capacitors, inductors and resistors. In some embodiments, more than one isolation structures may be formed in the semiconductor substrate. In certain embodiments, the device or components and the isolation structures are formed in the substrate 100 during the front-end-of-line (FEOL) processes. In some embodiments, the substrate 100 may include one or more insulation layers and metallization structures embedded in the insulation layer(s), and the devices and/or components are electrically connected with the metallization structures, and some of the device and/or components are further electrically interconnected through the metallization structures.

As shown in FIG. 1A and FIG. 1B, the insulating dielectric layer 110 may includes one or more dielectric layers. In some embodiments, a material of the insulating dielectric layer 110 includes silicon oxide, a spin-on dielectric material, a low-k dielectric material or a combination thereof. The formation of the insulating dielectric layer 110 includes performing one or more processes by chemical vapor deposition (CVD) or by spin-on, for example.

Referring to FIG. 1A and FIG. 1B, the insulating dielectric layer 110 is formed with openings O1. In one embodiment, the openings O1 are contact openings formed within the insulating dielectric layer 110 at locations predetermined for source and drain terminals. In some embodiments, the contact openings O1 are formed in the insulating dielectric layer 110 with a depth D1 (along the thickness direction Z1), and the opening depth D1 is smaller than a total thickness of the insulating dielectric layer 110. In some embodiments, the formation of the contact openings O1 includes forming a patterned mask layer (not shown) over the insulating dielectric layer 110, anisotropic etching the insulating dielectric layer 110 using the patterned mask layer as a mask to form contact openings O1 with a depth D1. From FIG. 1A, two contact openings O1 are shown and each contact opening O1 has a substantially square shaped top view. In one embodiment, the contact opening O1 with a substantially square shaped top view is formed with a dimension DS1. It is possible for the contact terminal to be formed with round, oval, rectangular, tetragonal or any suitable polygonal top view. It is understood that the number, the shape or the configuration of the structure(s) is not limited by the description or figures shown herein. As seen in FIG. 1B, the contact openings O1 are shown with substantially vertical sidewalls. It is understood that the contact openings may be formed with slant sidewalls if feasible.

Thereafter, in FIG. 1A and FIG. 1B, contact terminals 120 are formed in the contact openings O1. In some embodiments, each of the contact terminals 120 includes a barrier layer 122 and a metallic contact 124. For example, the barrier layer 122 is deposited over the contact openings O1 and conformally covers the sidewalls and bottoms of the contact openings O1, and metallic contacts 124 are then formed over the barrier layer 122 within the contact openings O1 and fill up the contact openings O1. In some embodiments, the barrier layer 122 is formed to prevent out-diffusion of the metallic material of the contact terminals 120. In some embodiments, a seed layer (not shown) may be formed over the contact openings O1 and on the barrier layer 122 for assisting the formation of the contact terminals 120. In one embodiment, as seen in FIG. 1A and FIG. 1B, two contact terminals 120 are formed, the contact openings O1 are formed separately in the insulating dielectric layer 110 with a distance DL (along the direction X1), and the resultant two contact terminals 120 are spaced apart from each other with the distance DL.

In some embodiments, the materials of the barrier layer 122 and the metallic contact 124 may individually include one or more materials selected tungsten (W), ruthenium (Ru), molybdenum (Mo), tantalum (Ta), titanium (Ti), alloys thereof, and nitrides thereof, for example. In some embodiments, the barrier layer 122 is formed by CVD, atomic layer deposition (ALD), or physical vapor deposition (PVD). In some embodiments, the metallic material of the metallic contact 124 is formed by CVD or PVD. In alternative embodiments, the formation of the metallic material may include performing a plating process (such as electrochemical plating (ECP)). In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the metallic contact 124 includes a tungsten contact and the barrier layer 122 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. In some embodiments, as seen in FIG. 1B, the top surface 110t of the insulating dielectric layer 110 is substantially flush with and levelled with the top surfaces 120t of the contact terminals 120. In some embodiments, the contact terminals 120 function as the source and drain terminals of the transistor.

Figure 2A:
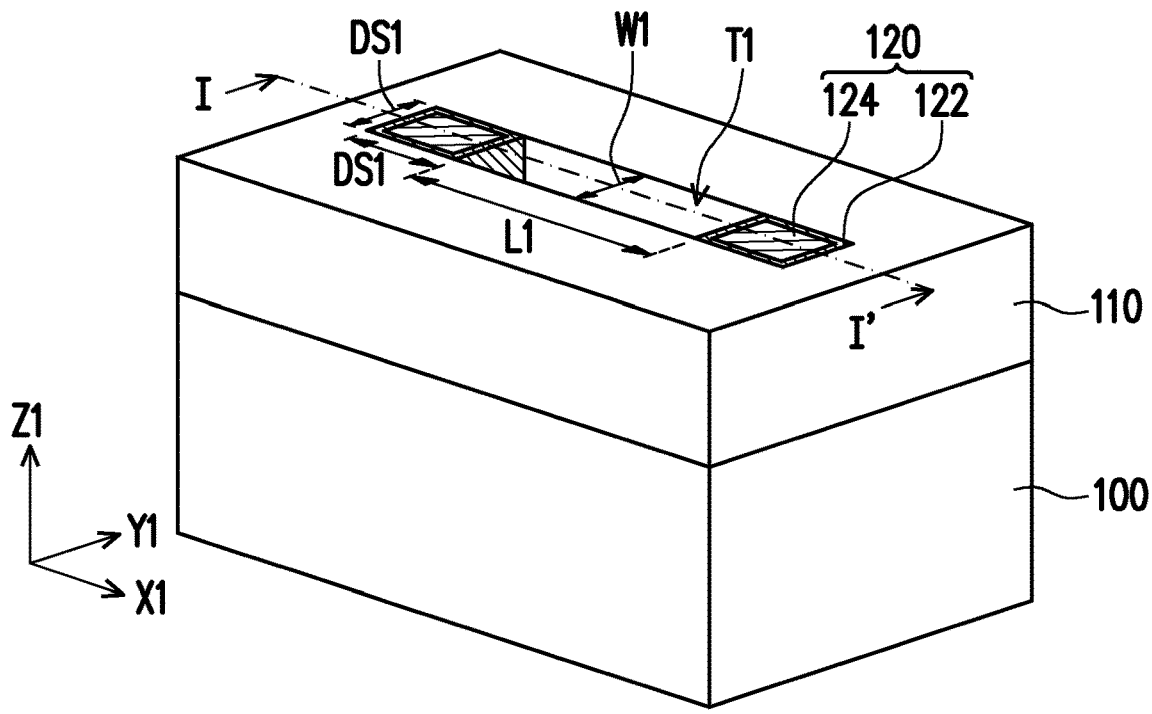
Figure 2B:
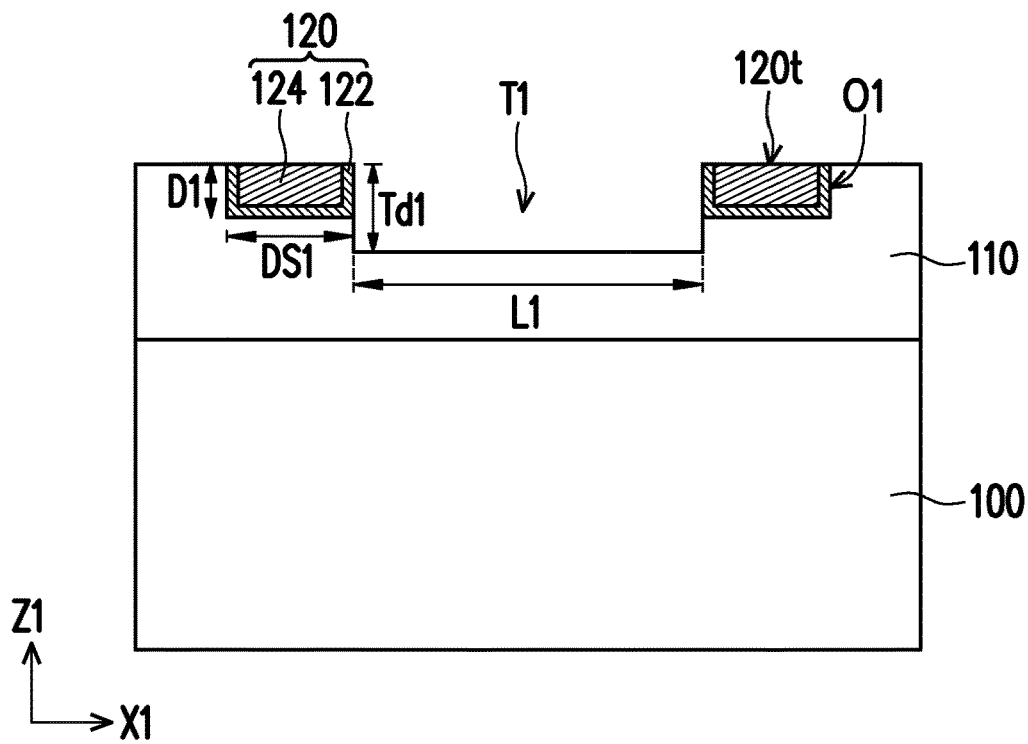

Referring to FIG. 2A and FIG. 2B, a trench T1 is formed within the insulating dielectric layer 110 with a depth Td1 (along the direction Z1). In one embodiment, the depth Td1 of the trench T1 is larger than the depth D1 of the contact openings O1. In some embodiments, the trench T1 is located exactly between the contact terminals 120, and the trench T1 is formed with a length L1 (along the extending direction X1) substantially equivalent to the distance DL, so that the sidewalls of the contact terminals 120 (i.e. sidewall of the barrier layer 122) are exposed. In some embodiments, the trench T1 is formed with a width W1 (along the direction Y1, that is at a right angle to the direction X1) substantially equivalent to the dimension DS1 (in the direction Y1). The formation of the trench T1 includes forming a patterned mask (not shown) over the insulating dielectric layer 110, and performing anisotropic etching to the insulating dielectric layer 110 using the patterned mask as an etching mask to form the trench T1 with a desirable shape or outline.

In various embodiments, the trench may be formed with a length larger or about the same as the distance between the contact terminals. In various embodiments, the trench may be formed with a width smaller or about the same as the dimension of the contact terminal(s). In various embodiments, the trench may be formed with a depth smaller, larger or about the same as the depth of the contact opening(s). The configuration and location of the trench may be adjusted or modified depending on the product design. It is possible for the trench to be formed with a band or strip shaped top view, and the trench may be formed with substantially vertical sidewalls or with slant sidewalls.

Figure 3A:
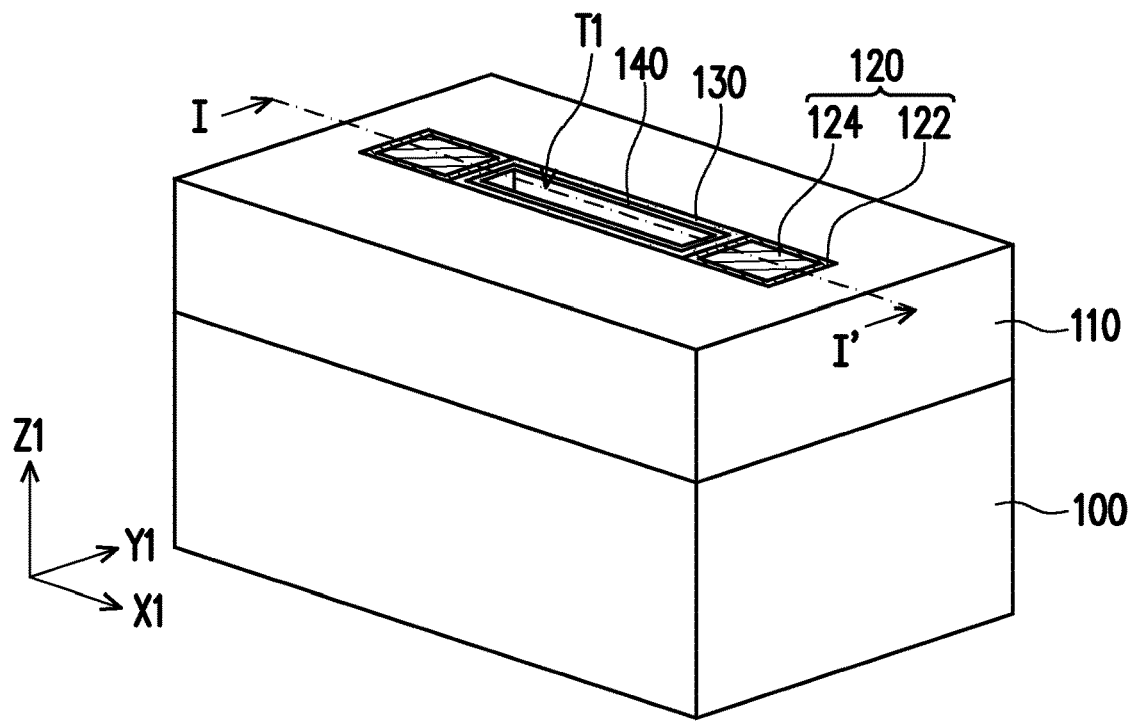
Figure 3B:
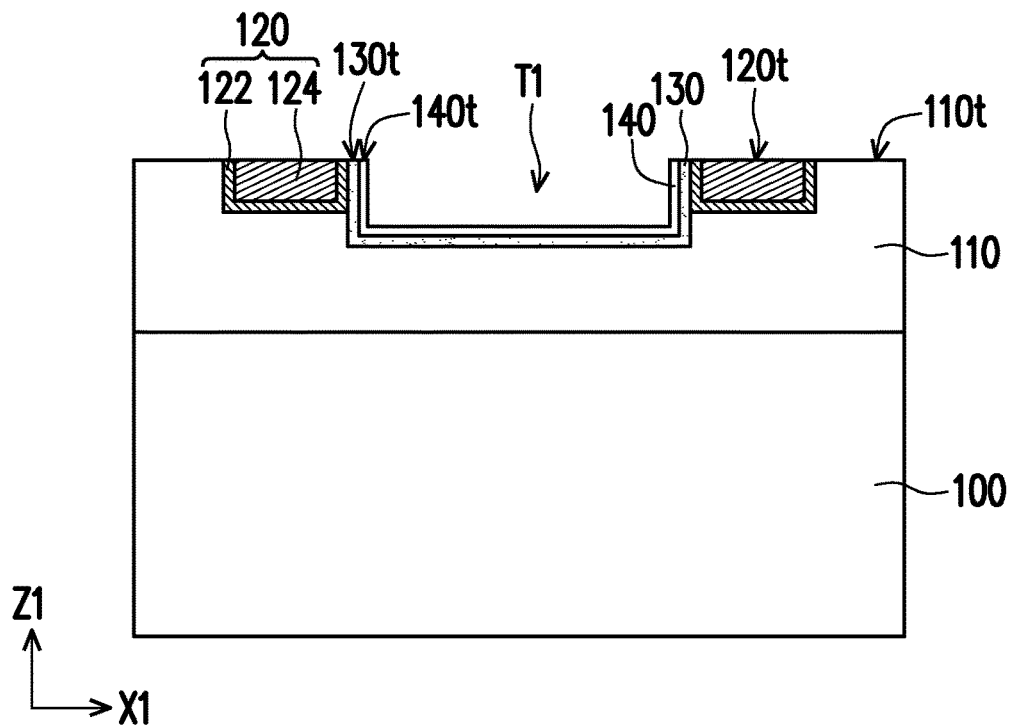

Referring to FIG. 3A and FIG. 3B, a channel layer 130 and a gate dielectric layer 140 are formed in the trench T1. In some embodiments, a channel material layer (not shown) and a dielectric material layer (not shown) are sequentially formed over the insulating dielectric layer 110 and conformally covering the exposed surfaces of the trench T1, and then the extra channel material and the extra dielectric material located on the top surface of the insulating dielectric layer 110 may be removed by performing a planarization process, an etching process, or other suitable processes. In some embodiments, the planarization process may include performing a CMP process. As seen in FIG. 3A and FIG. 3B, the channel layer 130 covers the sidewalls and the bottom surface of the trench T1, and the gate dielectric layer 140 covers the exposed surfaces (inner surfaces) of the channel layer 130 formed within the trench T1. That is, the outer surfaces of the channel layer 130 within the trench T1 are in physical contact with the insulating dielectric layer 110. After the planarization process, the top surface 110t of the insulating dielectric layer 110 is substantially flush with and levelled with the tops 130t, 140t of the channel layer 130 and the gate dielectric layer 140.

In one embodiment, the channel layer 130 is formed with a thickness ranging from about 1 nm to about 20 nm, and the gate dielectric layer 140 is formed with a thickness ranging from about 1 nm to about 20 nm. In some embodiments, the channel layer 130 has a thickness about the same as that of the gate dielectric layer 140, and the channel layer 130 is formed with a thickness of about 5 nm, and the gate dielectric layer 140 is formed with a thickness of about 5 nm. In some embodiments, the channel layer 130 includes an amorphous semiconductor material. In some embodiments, the material of the channel layer 130 includes indium gallium zinc oxide (IGZO). In certain embodiments, the material of the channel layer 130 includes amorphous IGZO. In some embodiments, the channel layer 130 includes a crystalline semiconductor material. In certain embodiments, the material of the channel layer 130 includes crystalline IGZO. In some embodiments, the material of the channel layer 130 includes conducting oxide semiconductor material such as indium zinc oxide (IZO) or zinc tin oxide (ZTO). In some embodiments, the formation of the channel layer 130 includes performing one or more deposition processes selected from CVD, ALD, and PVD. In some embodiments, the material of the gate dielectric layer 140 includes one or more high-k dielectric materials, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or combinations thereof. In some embodiments, the gate dielectric layer 140 includes one or more materials selected from aluminum oxide, hafnium oxide, tantalum oxide and zirconium oxide. In some embodiments, the formation of the gate dielectric layer 140 includes performing one or more deposition processes selected from CVD (such as, PECVD and laser-assisted CVD), ALD and PVD (such as, sputtering and e-beam evaporation). In one embodiment, the channel layer 130 and the gate dielectric layer 140 are formed sequentially through different deposition processes. In one embodiment, the channel layer 130 and the gate dielectric layer 140 are formed through similar or the same deposition process(es).

For example, as shown in FIG. 3A and FIG. 3B, the channel layer 130 and the gate dielectric layer 140 formed within the trench T1 are shaped as a topless box. In some embodiments, the channel layer 130 is located on and extends over the four sidewalls and the bottom surface of the trench T1, so that the channel area of the channel layer 130 is significantly increased. In some embodiments, the channel layer 130 is in direct contact with the contact terminals 120, and the channel layer 130 physically contacts the barrier layer(s) 122 of the contact terminal(s) 120, leading to zero extension (zero extension distance between the channel and the source/drain) and minimum extension resistance between the channel and the source/drain.

Figure 4A:
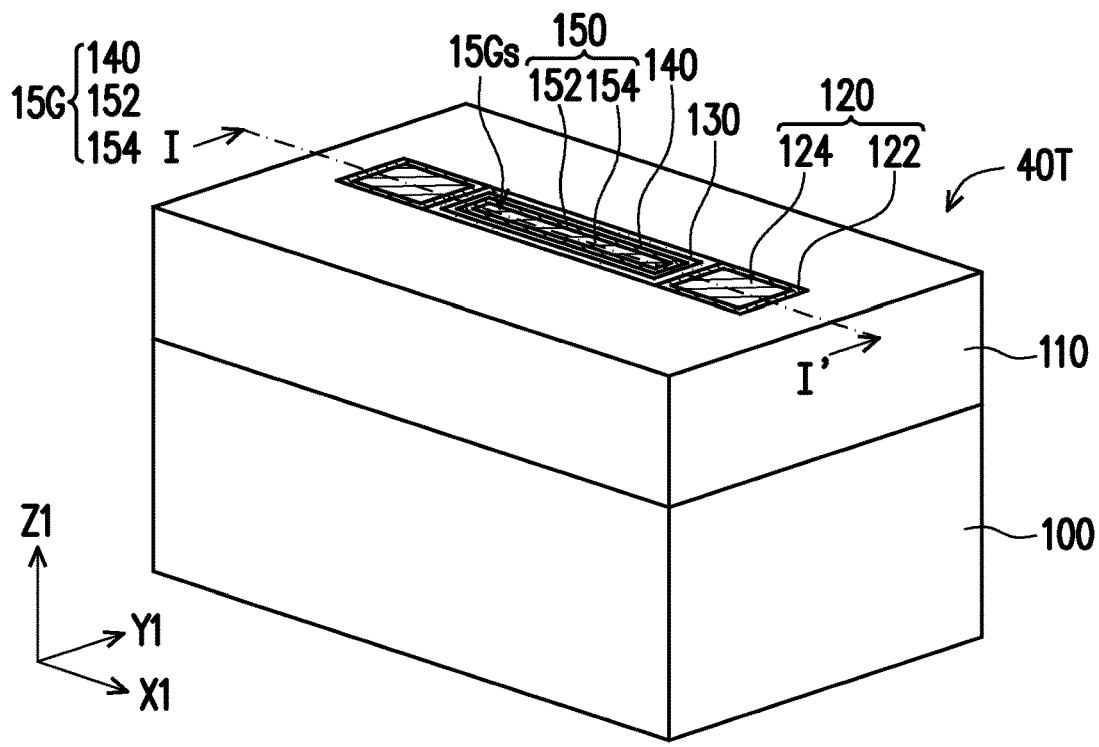
Figure 4B:
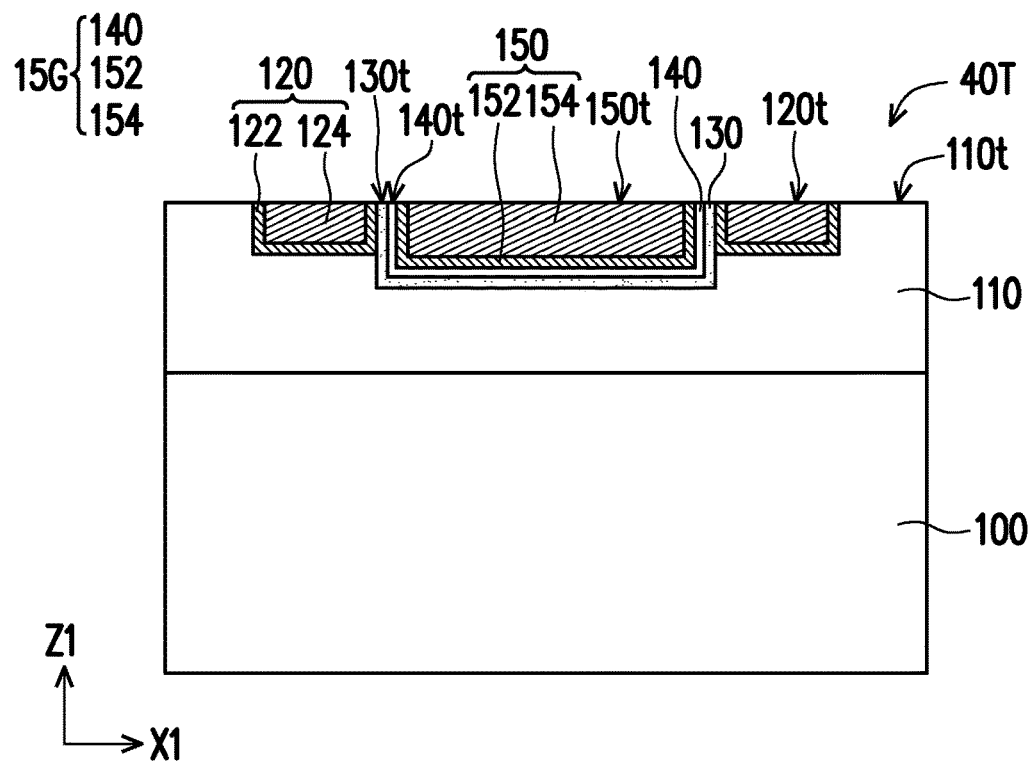

Referring to FIG. 4A and FIG. 4B, in some embodiments, a gate electrode structure 150 is formed on the gate dielectric layer 140 and fills up the trench T1. In some embodiments, the gate electrode structure 150 includes a liner layer 152 and a gate electrode 154. For example, the liner layer 152 may be blanketly deposited over the gate dielectric layer 140 and conformally covers the exposed surfaces of the gate dielectric layer 140, and then the gate electrode 154 is formed over the liner layer 152 within the trench T1 and fill up the trench T1. In embodiments, the formation of the gate electrode structure 150 includes forming a liner material (not shown) blanketly over the insulating dielectric layer 110 and the gate dielectric layer 140, and then forming a metallic material (not shown) on the liner material and over the gate dielectric layer 140, filling into the trench T1 and filling up the trench T1 to form the metallic gate electrode 154. In some embodiments, the extra liner material and the extra metallic material outside the trench T1 may be removed by performing a planarization process, an etching process, or other suitable processes. In some embodiments, the planarization process may include performing a CMP process. As seen in FIG. 4B, the top surface 150t of the gate electrode structure 150 is substantially flush with and levelled with the top surface 110t of the insulating dielectric layer 110 and the top surfaces 120t of the contact terminals 120.

In some embodiments, the liner layer 152 is formed to either improve the adhesion between the gate electrode 154 and the gate dielectric layer 140 and/or to prevent out-diffusion of the material of the gate electrode 154. In one embodiment, as seen in FIG. 4A and FIG. 4B, the gate electrode 154 is located in the middle and surrounded by the liner layer 152, and the gate dielectric layer 140 and the channel layer 130 further wraps around the liner layer 152 and the gate electrode 154. In some embodiments, the gate dielectric layer 140, the liner layer 152 and the gate electrode 154 constitute a gate structure 15G, and the top surface 15Gs is not covered by the surrounding channel layer 130. In FIG. 4A and FIG. 4B, the gate structure 15G is separate from the insulating dielectric layer 110 by the channel layer 130.

In some embodiments, the materials of the liner layer 152 and the metallic contact 154 may individually include one or more materials selected tungsten (W), ruthenium (Ru), molybdenum (Mo), tantalum (Ta), titanium (Ti), alloys thereof, and nitrides thereof, for example. In some embodiments, the liner layer 152 is formed by CVD, ALD or PVD. In some embodiments, the metallic material of the gate electrode 154 is formed by CVD or PVD. In alternative embodiments, the formation of the gate electrode 154 may include forming a seed layer (not shown) and performing a plating process (such as electrochemical plating (ECP)). In some embodiments, the material of the liner layer 152 includes titanium nitride (TiN), and the material of the gate electrode 154 includes tungsten.

In some embodiments, the contact terminals 120 that are located at opposite ends of the gate structure 15G function as the source and drain terminals of the transistor, and the contact terminals 120 are in direct contact with the channel layer 130 and connected to the gate structure 15G. In FIG. 4A and FIG. 4B, the gate structure 15G is separate from the contact terminals 120 by the channel layer 130. In FIG. 4A and FIG. 4B, a transistor structure 40T is obtained. The transistor structure 40T includes the gate structure 15G having the gate electrode structure 150 and the gate dielectric layer 140, the channel layer 130 (as the conducting channel region), and the contact terminals 120 (as the source and drain terminals) located at opposite ends of the gate structure 15G.

It is understood that transistor structure 40T may be electrically connected with the underlying active device(s) and/or components through the metallization structures in the substrate 100, although no detailed description is provided or depicted in the drawings.

Figure 5A:
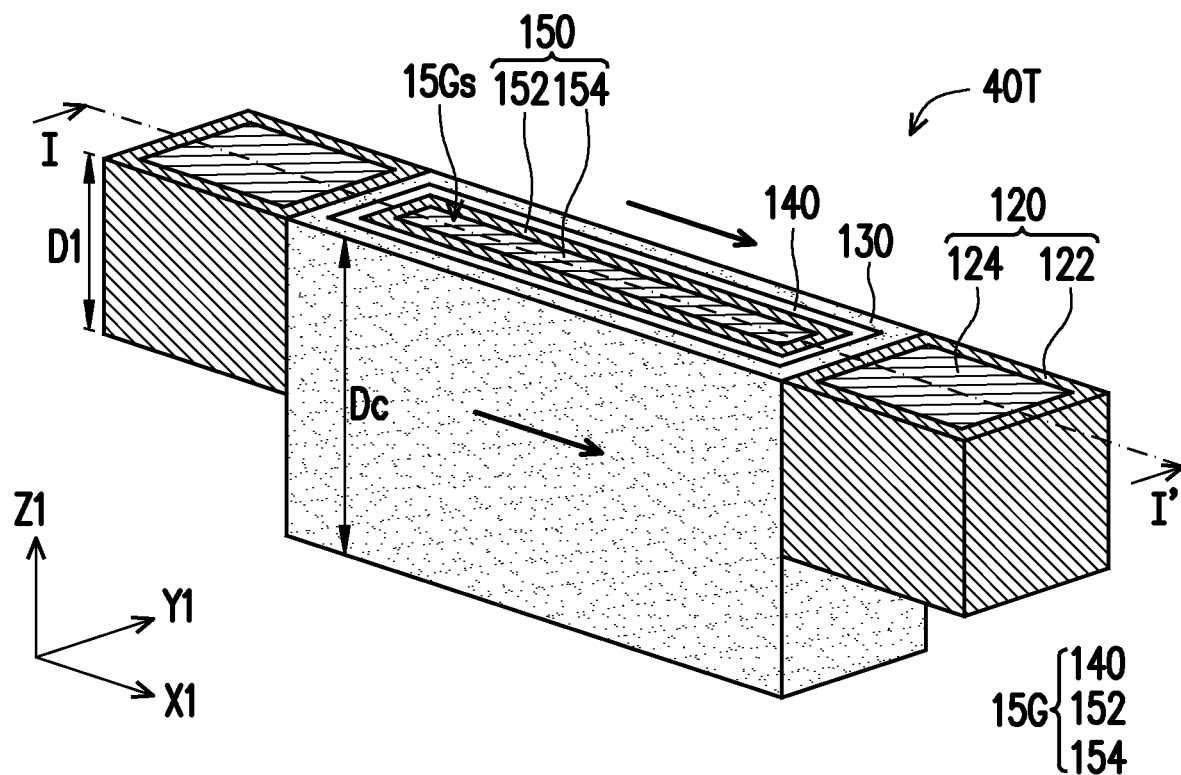
FIG. 5A, FIG. 5B and FIG. 5C are schematic 3D views respectively showing a semiconductor device from the top, from the bottom and a cross-section thereof in accordance with some embodiments of the disclosure.
Figure 5B:
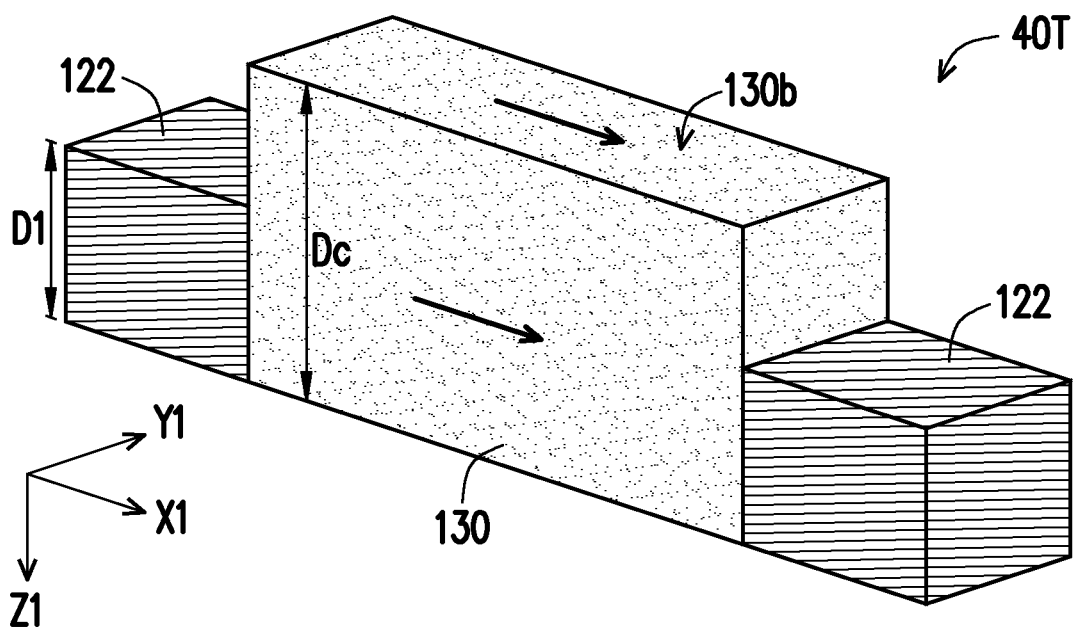
Figure 5C:
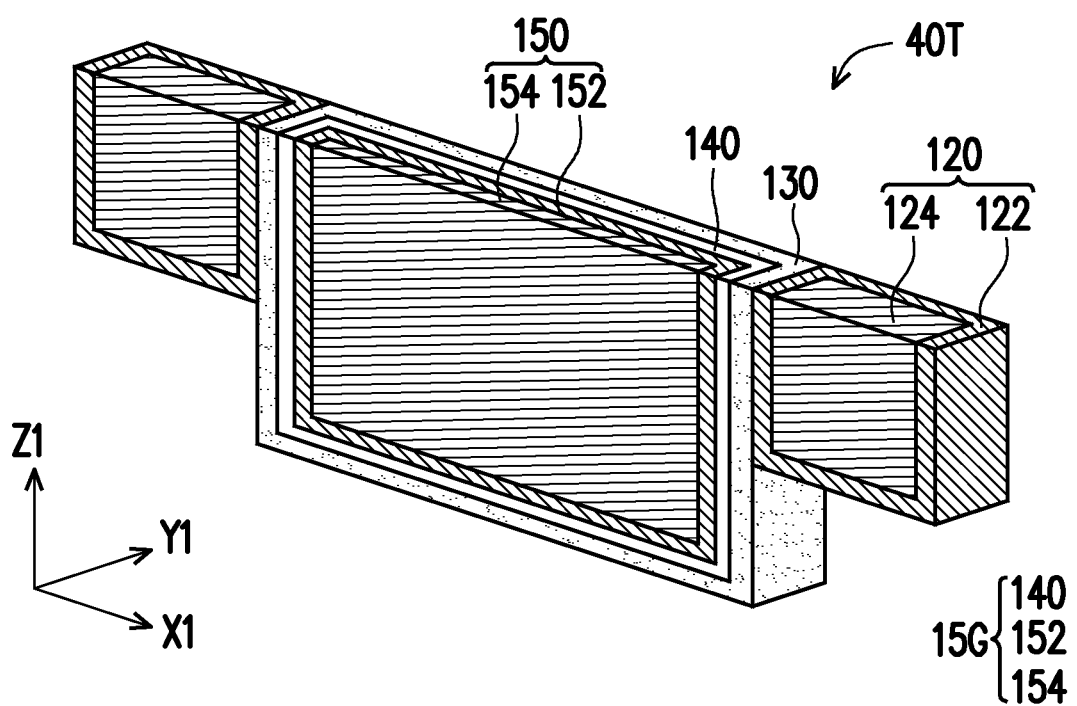

FIG. 5A, FIG. 5B and FIG. 5C are schematic 3D views respectively showing a semiconductor device from the top, from the bottom and a cross-section thereof in accordance with some embodiments of the disclosure. The exemplary structure shown in FIG. 5A, FIG. 5B and FIG. 5C may be fabricated following the process steps as described in the previous embodiments as shown from FIG. 1A to FIG. 4B, but it is understood that any other compatible process steps or methods may be utilized and comprehensible modifications or adjustments may be made for forming the exemplary structure of this disclosure. In FIG. 5A, FIG. 5B and FIG. 5C, the insulating dielectric layer 110 and the underlying layer(s) are omitted for simplicity. FIG. 5C is a schematic cross-sectional view along the sectional line I-I' of FIG. 5A.

In FIG. 5A, FIG. 5B and FIG. 5C, in some embodiments, a transistor structure 40T includes the gate structure 15G having the gate dielectric layer 140, the liner layer 152 and the gate electrode 154, the channel layer 130, and the contact terminals 120 located on two opposite sides of the gate structure 15G. In FIG. 5A, FIG. 5B and FIG. 5C, the channel layer 130 is formed with a depth Dc (along the direction Z1) larger than the depth D1 (along the direction Z1) of the contact terminal(s) 120. In some embodiments, because the channel layer 130 is formed in the trench T1 (see FIG. 2B) with a depth Td1 (along the direction Z1) and the contact terminal(s) 120 is formed within the contact opening(s) O1 (see FIG. 1B) with a depth D1, and the trench T1 is deeper than the contact opening(s) O1, the channel layer 130 extends into a deeper depth than the contact terminal(s) 120.

From FIG. 5A, FIG. 5B and FIG. 5C, the gate structure 15G is shaped like a rectangular stripe block, extending in the direction X1 and the channel layer 130 is shaped like a hollow box sheathing the rectangular stripe block. That is, the gate structure 15G is walled and enclosed by the channel layer 130. In some embodiments, the top surface 15Gs of the gate structure 15G is exposed from the channel layer 130 and is uncovered by the channel layer 130. Also, from FIG. 5A, FIG. 5B and FIG. 5C, the contact terminals 120 are shaped like square or four-sided blocks respectively located by both opposite line ends of the gate structure 15G (the short sides of the gate structure 15G). As the channel layer 130 extends over at least the four sides (extending on short side sidewalls and long side sidewalls) of the gate structure 15G, the current (represented by the arrows) flows from the source through the conducting channel region of the channel layer 130 located on the long sides and the bottom surface of the gate structure 15G to the drain, and the channel area of the channel layer 130 is greatly increased. In FIG. 5B, the current flows through the bottom surface 130b of the channel layer 130. In some embodiments, the channel layer 130 at least encircles and covers four side surfaces of the gate structure 15G. In some embodiments, the channel layer 130 covers five side surfaces of the gate structure 15G (two opposite long side surfaces, two opposite short side surfaces and the bottom surface connecting the four side surfaces). In some embodiments, the transistor structure 40T may be referred as a channel-around-gate type transistor structure.

In some embodiments, sine both of the channel region and the gate structure are formed within the trench and the gate structure is formed after the formation of the channel region or layer, the channel region wraps around the gate structure and the area of the conducting channel region is significantly increased. The three-dimensional configuration of the channel layer makes the conducting area of the channel region much larger and leads to improved device performance.

FIG. 6A-6B, FIG. 7A-7B, FIG. 8A-8B and FIG. 9A-9B are schematic 3D views respectively showing semiconductor devices and cross-sectional views thereof in accordance with some embodiments of the disclosure. The exemplary structure shown in FIG. 6A-6B, FIG. 7A-7B, FIG. 8A-8B and FIG. 9A-9B may be fabricated following similar process steps as described in the previous embodiments as shown from FIG. 1A to FIG. 4B, but it is understood that any other compatible process steps or methods may be utilized and comprehensible modifications or adjustments may be made for forming the exemplary structure of this disclosure. In FIG. 6A-6B, FIG. 7A-7B, FIG. 8A-8B and FIG. 9A-9B, the insulating dielectric layer 110 and the underlying layer(s) are omitted for simplicity. FIG. 6B, FIG. 7B, FIG. 8B and FIG. 9B are schematic cross-sectional views along the sectional lines I-I' of FIG. 6A, FIG. 7A, FIG. 8A and FIG. 9A respectively.

Figure 6A:
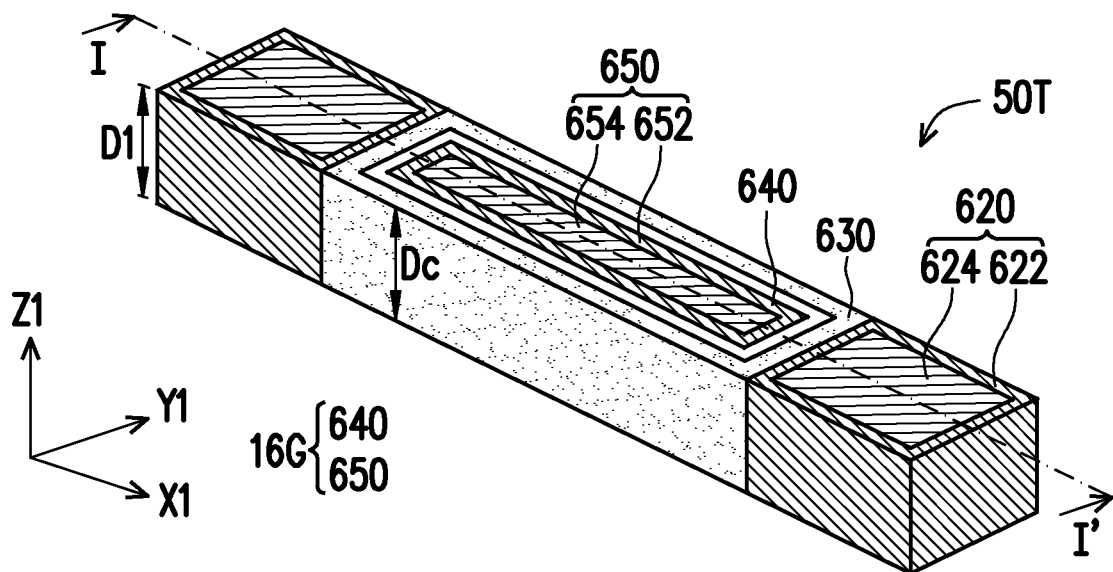
FIG. 6A-6B, FIG. 7A-7B, FIG. 8A-8B and FIG. 9A-9B are schematic 3D views respectively showing semiconductor devices and cross-sectional views thereof in accordance with some embodiments of the disclosure.
Figure 6B:
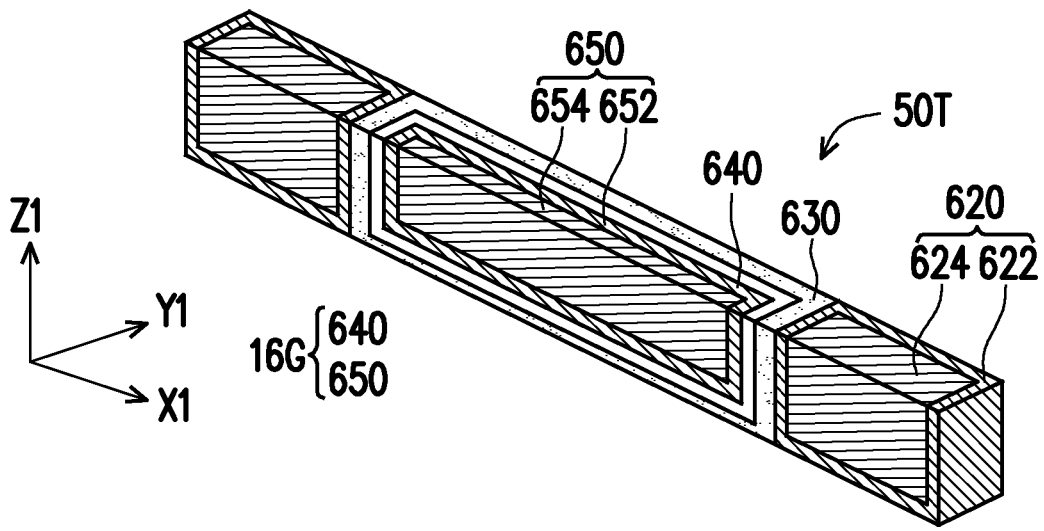

Referring to FIG. 6A and FIG. 6B, in some embodiments, a transistor structure 50T includes the gate structure 16G having the gate electrode structure 650 (including a liner layer 652 and a gate electrode 654) and the gate dielectric layer 640, the channel layer 630 (as the conducting channel region), and the contact terminals 620 (as the source and drain terminals) located at opposite ends of the gate structure 16G. The configurations of the transistor structure 50T are similar to the configurations of the transistor structure 40T, except for the depth of the channel layer. In some embodiments, the channel layer 630 is formed with a depth Dc (along the direction Z1) substantially equivalent the depth D1 (along the direction Z1) of the contact terminal(s) 620, and the channel layer 630 extends into a depth about the same as that of the contact terminal(s) 620.

Figure 7A:
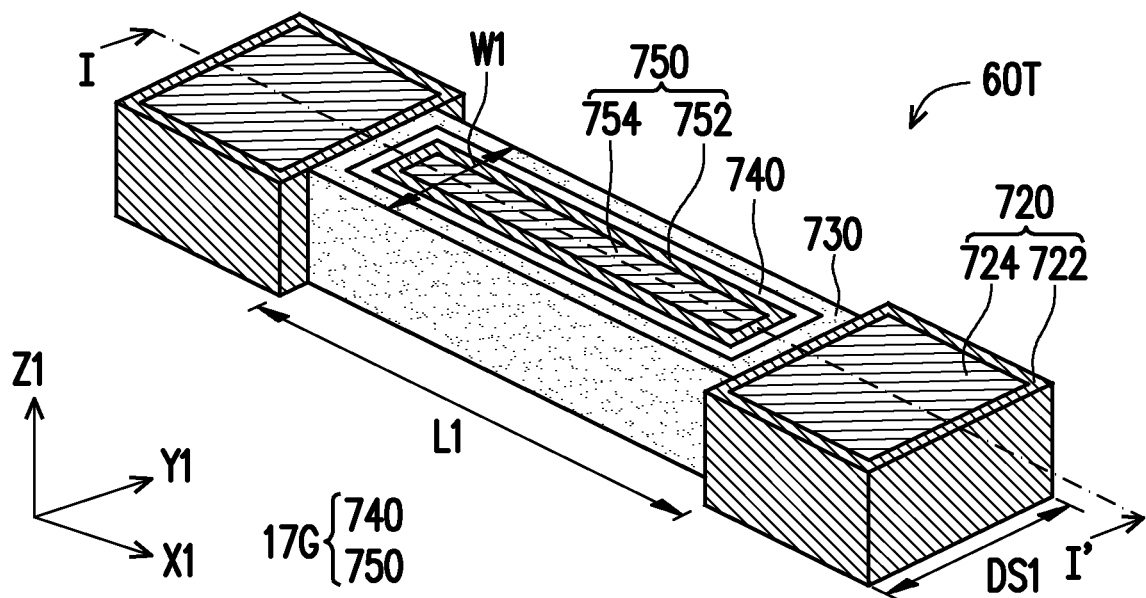
Figure 7B:
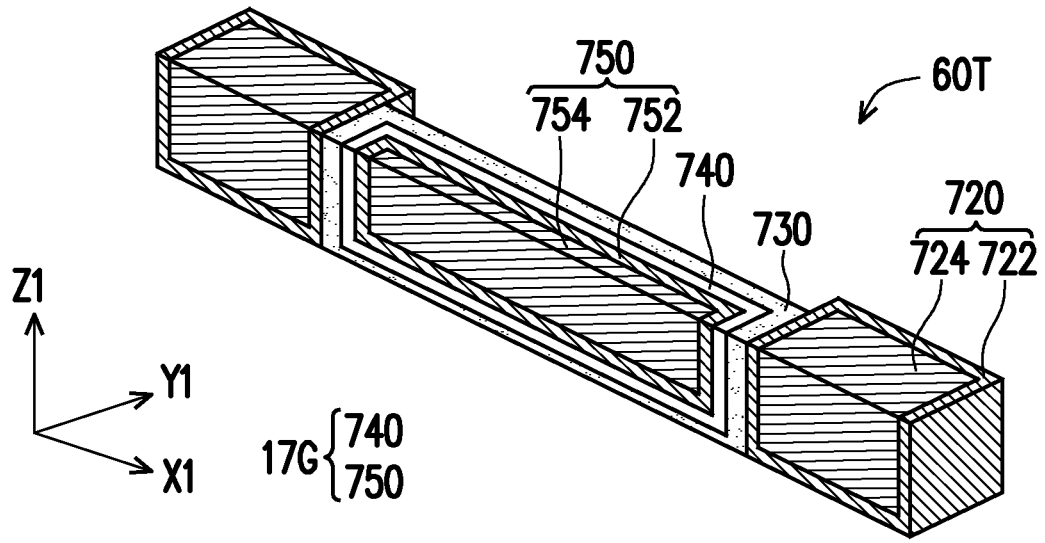

Referring to FIG. 7A and FIG. 7B, in some embodiments, a transistor structure 60T includes the gate structure 17G having the gate electrode structure 750 (including a liner layer 752 and a gate electrode 754) and the gate dielectric layer 740, the channel layer 730 (as the conducting channel region), and the contact terminals 720 (as the source and drain terminals) located at opposite ends of the gate structure 17G. The configurations of the transistor structure 60T are similar to the configurations of the transistor structure 50T, except for the width of the channel layer. In some embodiments, as the trench is formed with the width W1 (along the direction Y1), the channel layer 730 is formed with a span width W1 (along the direction Y1) smaller than the width DS1 (dimension along the direction Y1) of the contact terminal(s) 720. In some embodiments, the channel layer 730 is in direct contact with the barrier layers 722 of the two contact terminals 720, without touching the metallic contacts 724. The channel layer 730 extends between the contact terminals 720 and adjoins with the contact terminals 720. That is, the length L1 of the channel layer 730 is substantially the same as the distance between the two contact terminals 720, leading to zero extension distance between the channel layer and the contact terminal.

Figure 8A:
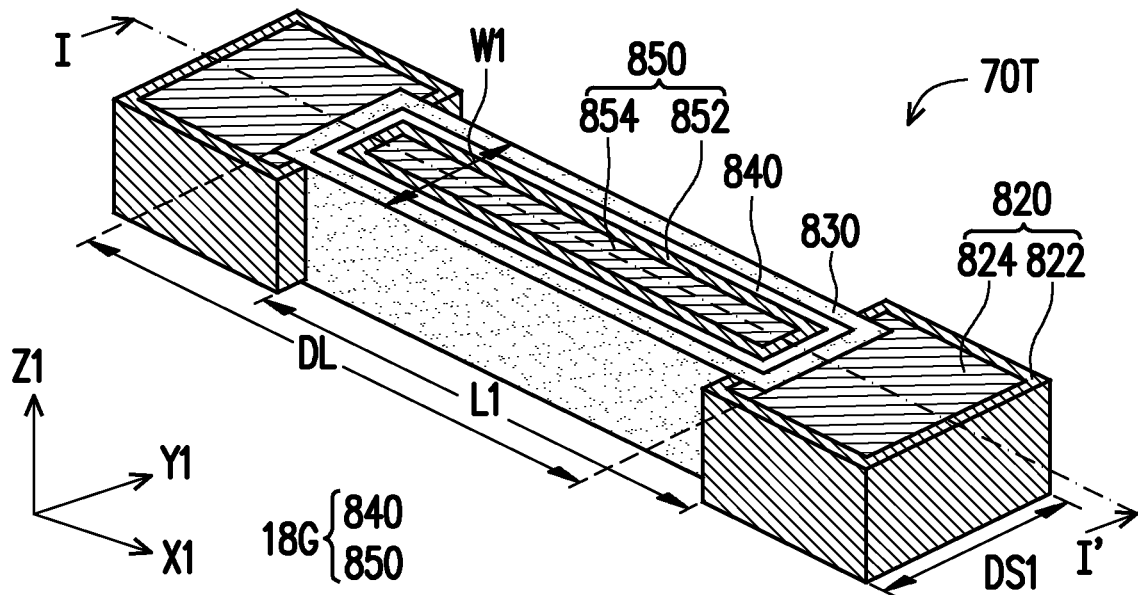
Figure 8B:
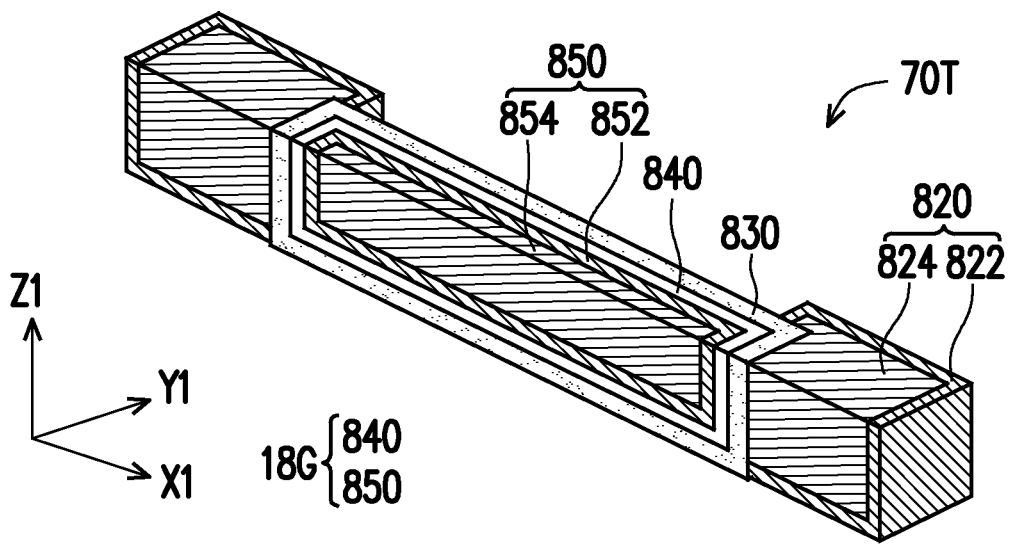

Referring to FIG. 8A and FIG. 8B, in some embodiments, a transistor structure 70T includes the gate structure 18G having the gate electrode structure 850 (including a liner layer 852 and a gate electrode 854) and the gate dielectric layer 840, the channel layer 830 (as the conducting channel region), and the contact terminals 820 (as the source and drain terminals) located at opposite ends of the gate structure 18G. The configurations of the transistor structure 70T are similar to the configurations of the transistor structure 60T, except for the length of the channel layer. In some embodiments, the channel layer 830 is formed with a span width W1 smaller than the width (dimension in the direction Y1) DS1 of the contact terminal(s) 820. In some embodiments, the channel layer 830 extends into the two contact terminals 820 and is in direct contact with the metallic contacts 824 and the barrier layers 822 of the two contact terminals 820. That is, the length L1 (along the direction X1) of the channel layer 830 is larger than the distance DL (along the direction X1) between the two contact terminals 820. The channel layer 830 not only extends between the contact terminals 820 and adjoins with the contact terminals but also extends beyond and protrudes into the contact terminals 820.

Figure 9A:
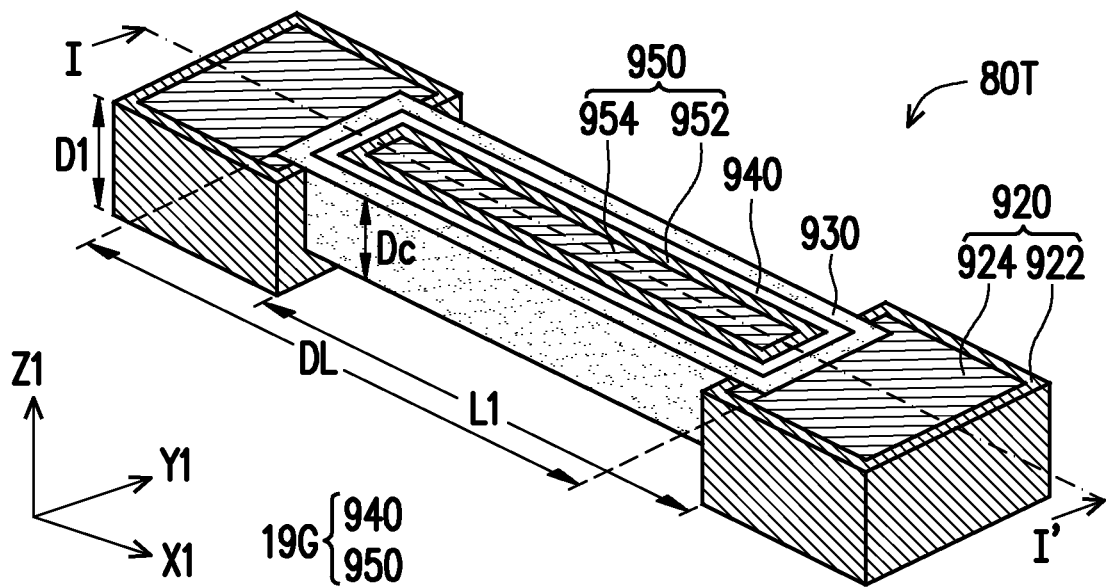
Figure 9B:
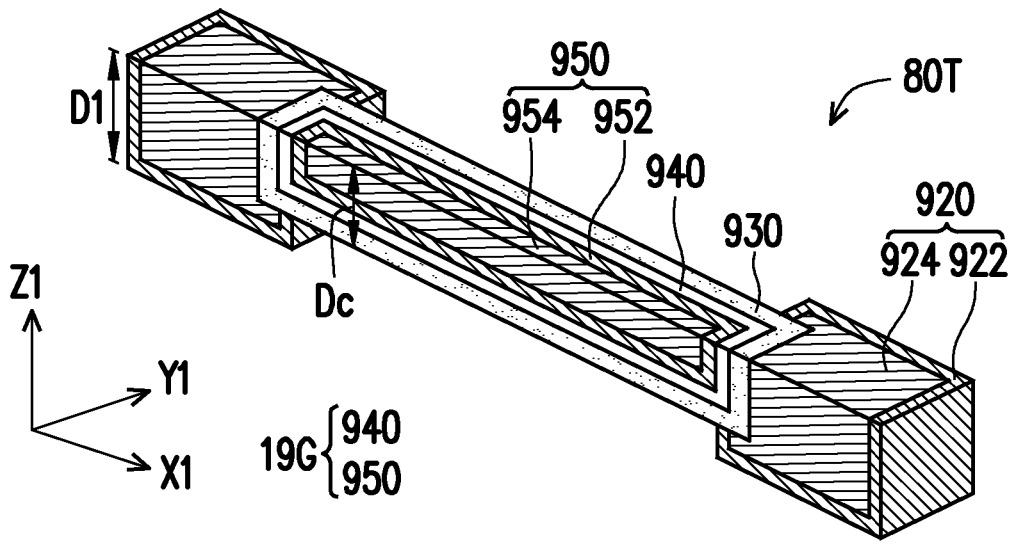

Referring to FIG. 9A and FIG. 9B, in some embodiments, a transistor structure 80T includes the gate structure 19G having the gate electrode structure 950 (including a liner layer 952 and a gate electrode 954) and the gate dielectric layer 940, the channel layer 930 (as the conducting channel region), and the contact terminals 920 (as the source and drain terminals) located at opposite ends of the gate structure 19G. The configurations of the transistor structure 80T are similar to the configurations of the transistor structure 70T, except for the depth of the channel layer. In some embodiments, the channel layer 930 extends into the two contact terminals 920 and is in direct contact with the metallic contacts 924 and the barrier layers 922 of the two contact terminals 920. That is, the length L1 (along the direction X1) of the channel layer 930 is larger than the distance DL (along the direction X1) between the two contact terminals 920. In some embodiments, the channel layer 930 is formed with a depth Dc (along the direction Z1) smaller than the depth D1 (along the direction Z1) of the contact terminal(s) 920, and the channel layer 930 extends into a depth shallower than that of the contact terminal(s) 920.

From the above embodiments, the channel layer physically and electrically contacts the contact terminals and extends from one of the source and drain terminals to the other. However, it is clearly seen that the gate structure is separate from the contact terminals by the channel layer (with the channel layer sandwiched therebetween). That is, the channel layer like a box sheaths and surrounds the gate structure, covering the four lateral side surfaces and the bottom surface of the gate structure.

In various embodiments, depending on the relative configurations and locations of the trench and the contact openings, the configuration of the channel layer may vary or change depending on the product design.

Figure 11:
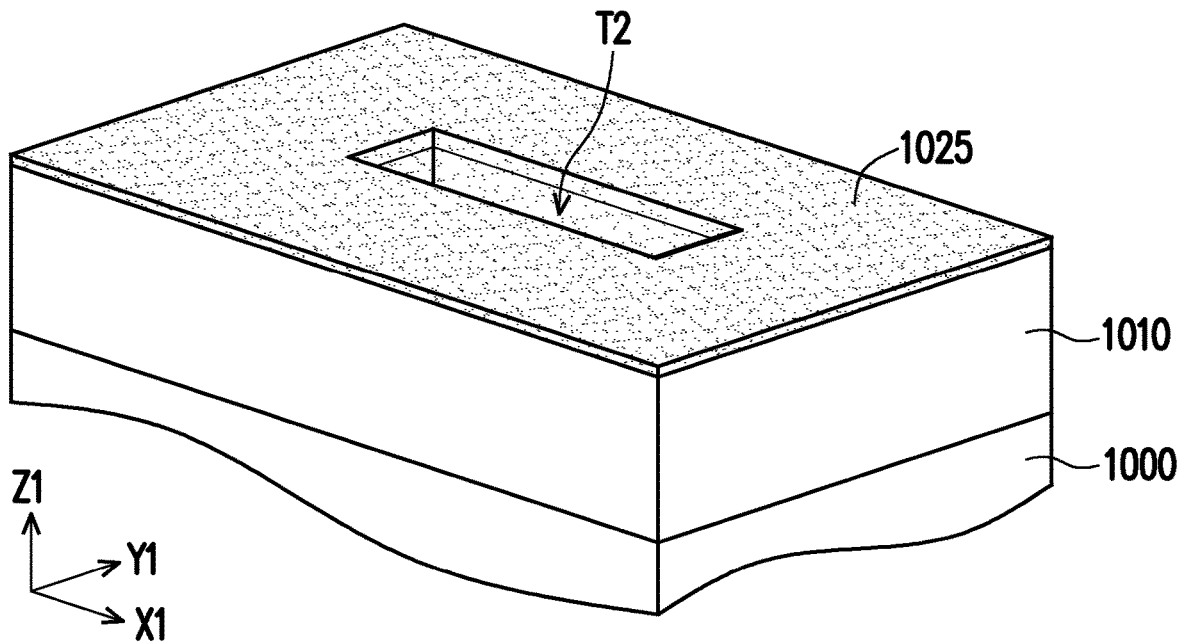
Figure 12:
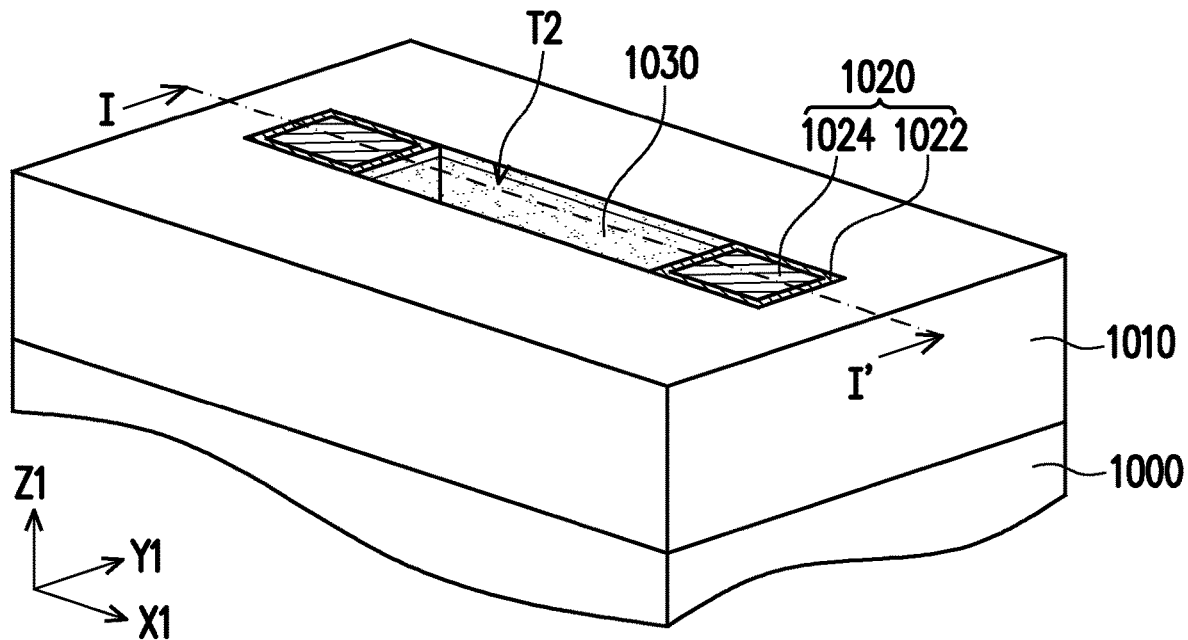
Figure 12A:
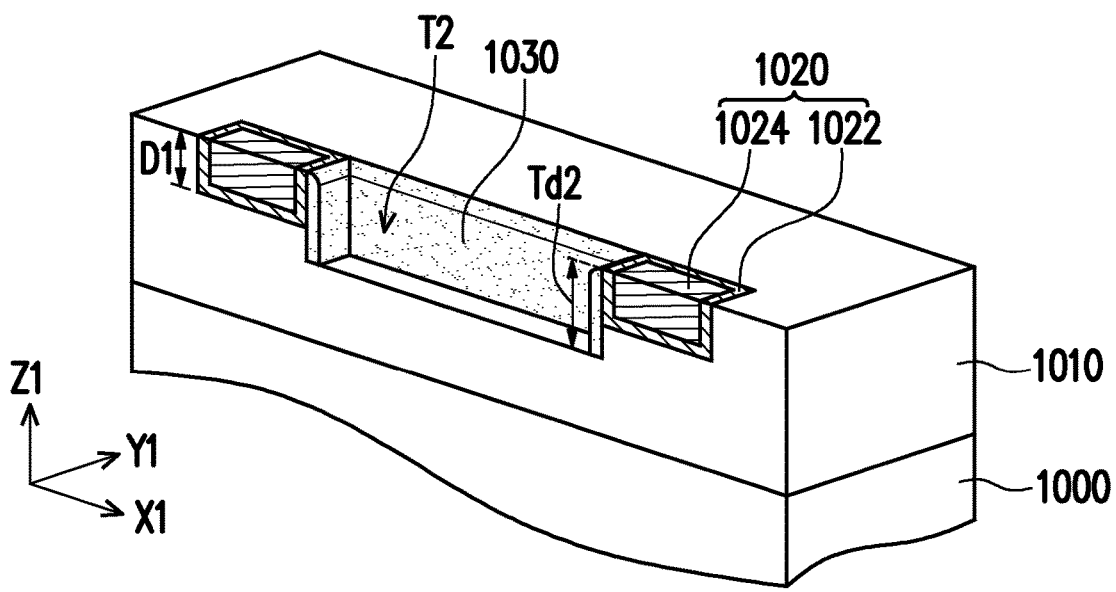
FIG. 12A and FIG. 13A are schematic 3D views respectively showing cross-sections of the semiconductor devices of FIG. 12 and FIG. 13 in accordance with some embodiments of the disclosure.

FIG. 10 to FIG. 13 are schematic 3D views of various stages in a manufacturing method of a semiconductor device in accordance with some embodiments of the disclosure. FIG. 12A and FIG. 13A are schematic 3D views respectively showing cross-sections along lines I-I' of the structures of FIG. 12 and FIG. 13.

Figure 10:
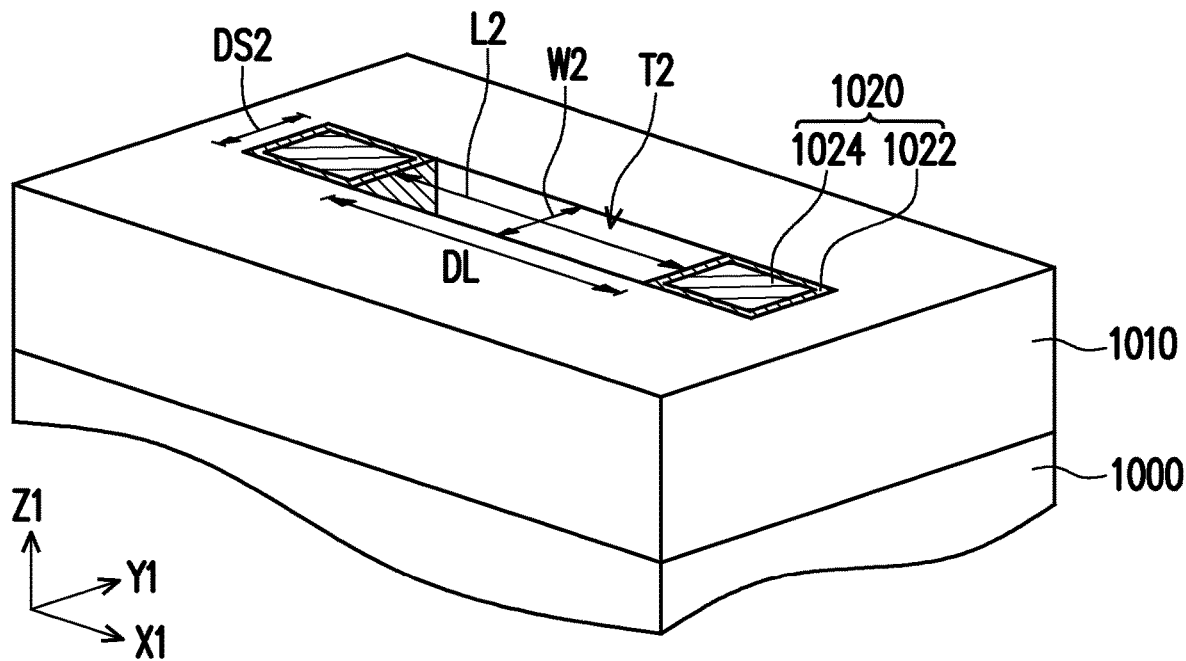
FIG. 10 to FIG. 14 are schematic 3D views of various stages in a manufacturing method of a semiconductor device in accordance with some embodiments of the disclosure.

Referring to FIG. 10, in some embodiments, a substrate 1000 having an insulating dielectric layer 1010 is provided, and two contact terminals 1020 are formed in the insulating dielectric layer 1010. The substrate 1000 may be similar to the substrate 100 as described in the above embodiments. In some embodiments, each contact terminal 1020 includes a barrier layer 1022 and a metallic contact 1024. The materials, the formation methods and the configurations are similar and may refer to the descriptions provided in the above embodiments. In some embodiments, a trench T2 is formed within the insulating dielectric layer 1010 with a depth Td2 (along the direction Z1). In one embodiment, the depth Td2 of the trench T2 is larger than the depth D1 of the contact terminals 1020, as shown in FIG. 12A. In some embodiments, the trench T2 is located exactly between the contact terminals 1020, and the trench T2 is formed with a length L2 (along the X1 direction) substantially equivalent to the distance DL between the two contact terminals 1020, so that the sidewalls of the contact terminals 1020 (i.e. sidewalls of the barrier layer 1022) are exposed. In some embodiments, the trench T2 is formed with a width W2 (along the direction Y1) substantially equivalent to the dimension DS2 of the contact terminal(s) 1020. The configuration and location of the trench may be adjusted or modified depending on the product design.

Referring to FIG. 11, a channel material layer 1025 is formed over the insulating dielectric layer 1010 and conformally covering the exposed surfaces of the trench T2. Referring to FIG. 12, in some embodiments, a removal process is performed to the channel material layer 1025 to remove the extra channel material to form a channel layer 1030. In some embodiments, the removal process removes the extra channel material that is located on the top surface of the insulating dielectric layer 1010 as well as the channel material that is located on the bottom surface of the trench T2 so as to form a channel layer 1030. In some embodiments, the removal process includes an etching process, such as a tapered etching process, or an anisotropic etching process performed at a tilted angle relative to the vertical direction Z1. As seen in FIG. 12 and FIG. 12A, the channel layer 1030 covers the lateral sidewalls of the trench T2 without covering the bottom surface of the trench T2. That is, the insulating dielectric layer 1010 at the bottom of the trench T2 (i.e. bottom surface of the trench T2) is exposed.

Figure 13:
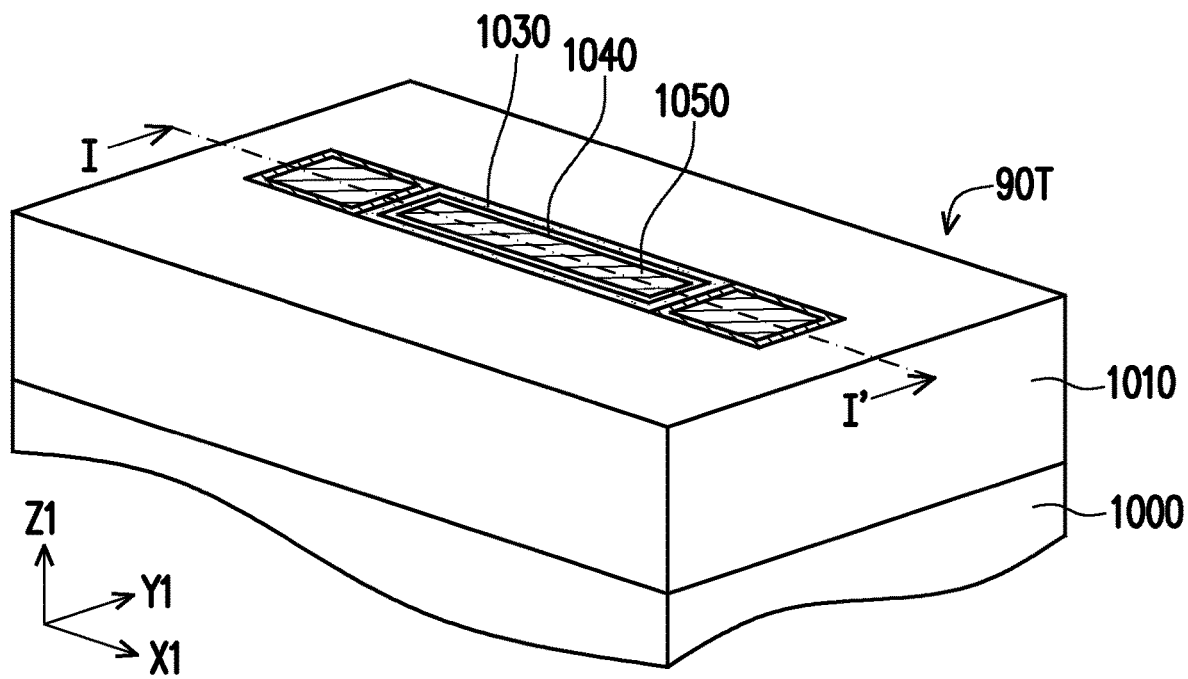
Figure 13A:
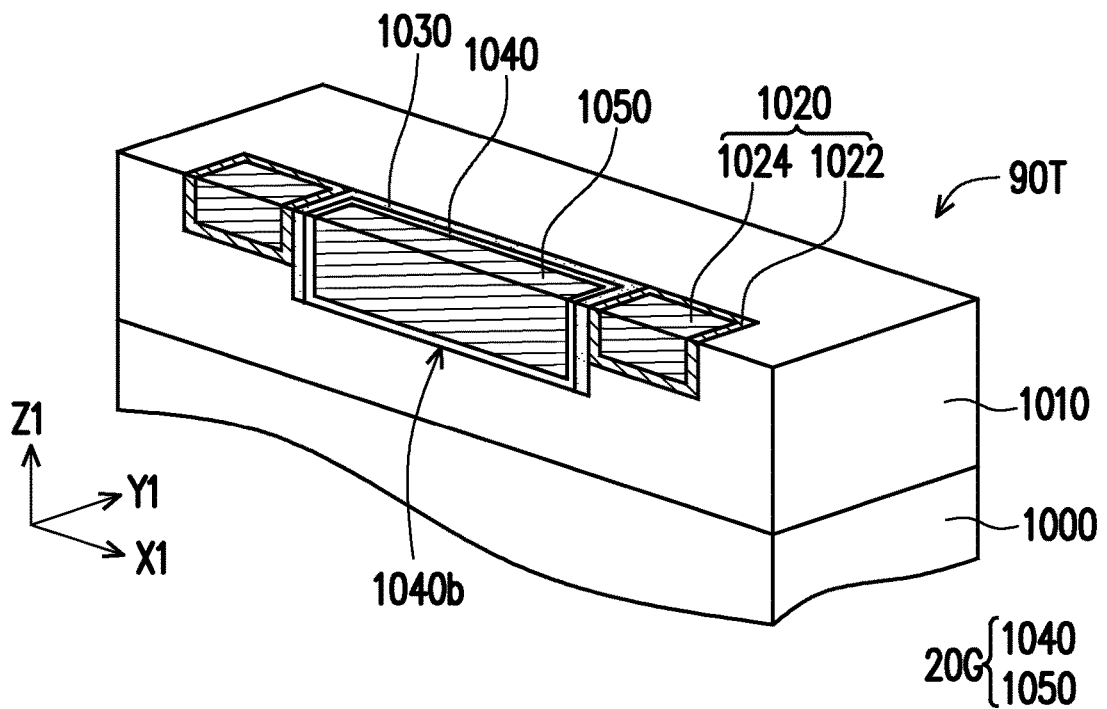

Referring to FIG. 13 and FIG. 13A, the gate structure 20G is formed on the channel layer 1030 within the trench T2 and fills up the trench T2. The formation of the gate structure 20G including forming a gate dielectric layer 1040 covering the insulating dielectric layer 1010 exposed at the trench bottom and covering the channel layer 1030 located at four sidewalls of the trench T2, and forming gate electrode structure 1050 on the gate dielectric layer 1040 and filling up the trench T2. In some embodiments, a planarization process and/or an etching process may be performed to remove the extra material, and the top surface of the insulating dielectric layer 1010 is substantially flush with and levelled with the top surface of the gate electrode structure 1050 and the tops of the channel layer 1030 and the gate dielectric layer 1040.

Figure 13B:
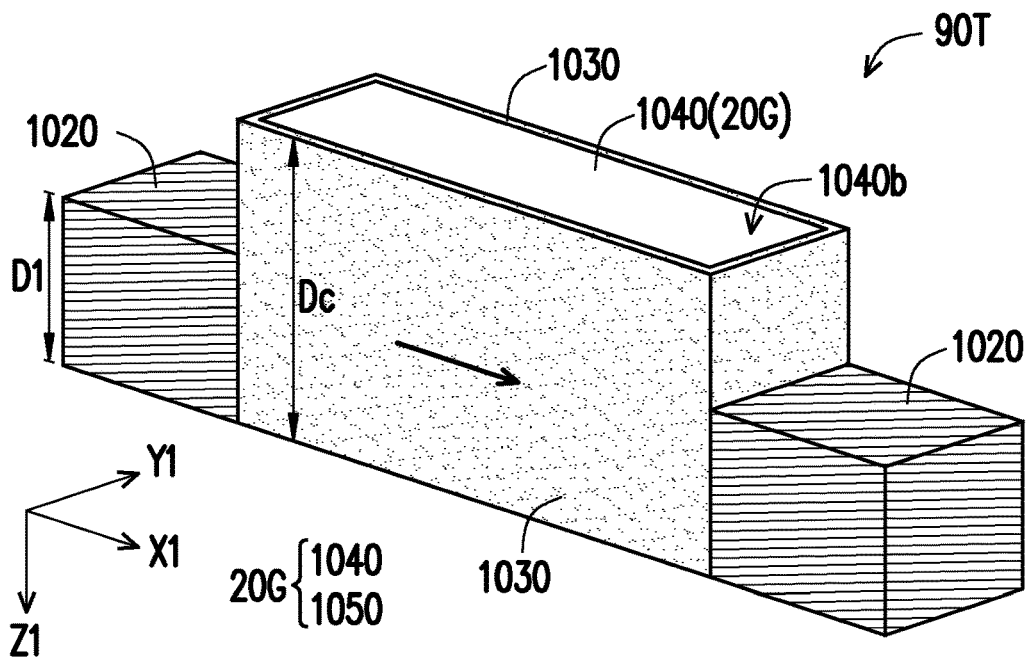
FIG. 13B is a schematic 3D view showing a semiconductor device from the bottom thereof in accordance with some embodiments of the disclosure.

FIG. 13B is a schematic 3D view showing the device of FIG. 13 from the bottom view in accordance with some embodiments of the disclosure. In FIG. 13B, the insulating dielectric layer 1010 and the underlying layer(s) are omitted for simplicity. In FIG. 13, FIG. 13A and FIG. 13B, in some embodiments, a transistor structure 90T includes the gate structure 20G having the gate dielectric layer 1040 and the gate electrode structure 1050, the channel layer 1030, and the contact terminals 1020 located on two opposite sides of the gate structure 20G. In FIG. 13B, the channel layer 1030 extends in the direction Z1 with a depth Dc larger than the depth D1 (along the direction Z1) of the contact terminal(s) 1020. In some embodiments, the channel layer 1030 is shaped like a hollow wall surrounding or walling the gate structure 20G that is shaped like a block. In some embodiments, the bottom surface 1040b of the gate dielectric layer 1040 of the gate structure 20G is uncovered by the channel layer 1030 and exposed from the channel layer 1030, from the bottom view of FIG. 13B. In some embodiments, in FIG. 13A, the exposed bottom surface 1040b of the gate dielectric layer 1040 is in direct contact with the underlying insulating dielectric layer 1010. Also, from FIG. 13B, the contact terminals 1020 are shaped like square or four-sided blocks respectively located at the short sides of the gate structure 20G. As the channel layer 1030 extending between the contact terminals 1020 covers the four lateral sides (short sides and long sides) of the gate structure 20G, the current (represented by the arrows) flows from the source through the conducting channel region of the channel layer 1030 located on long sides of the gate structure 20G to the drain, and the channel area of the channel layer 1030 is greatly increased. In some embodiments, the transistor structure 90T may be referred as a channel-around-gate type transistor structure.

Figure 14:
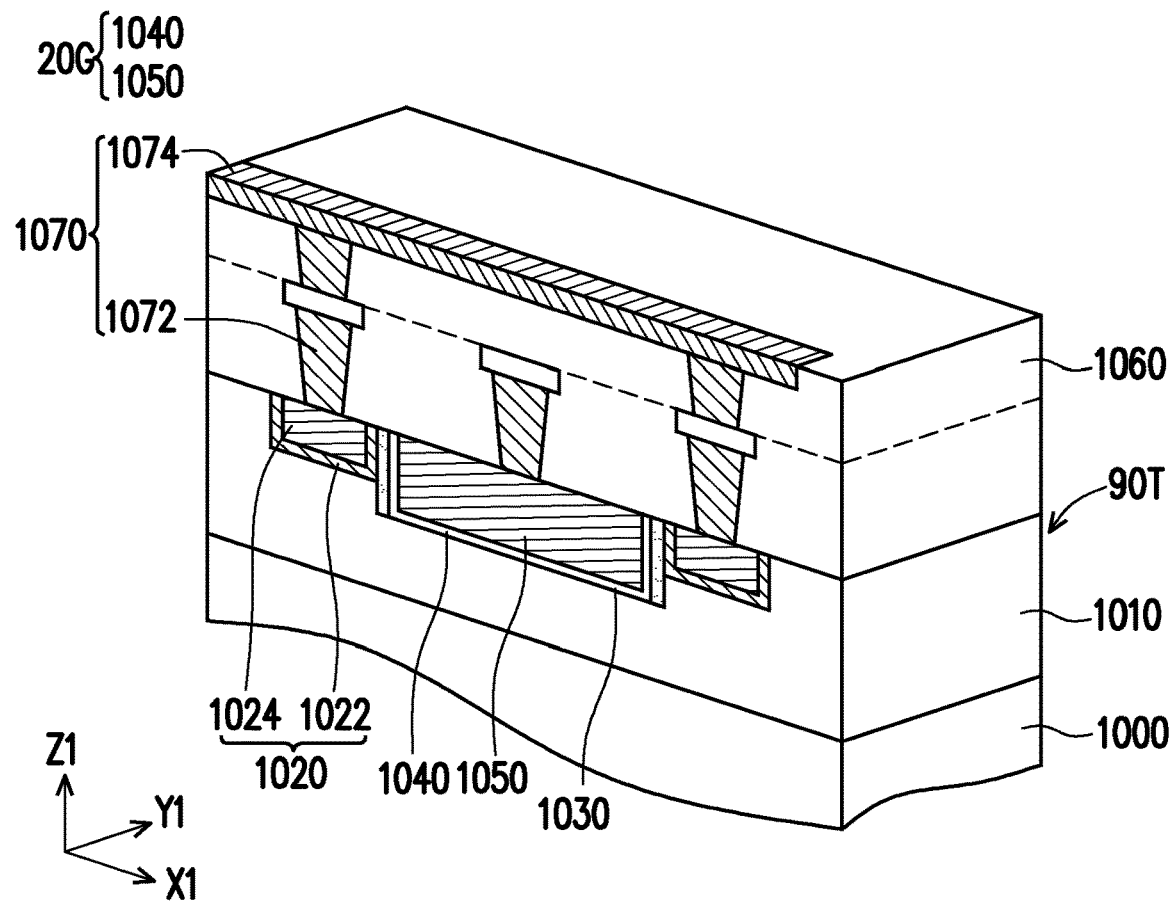

FIG. 14 is a schematic 3D view showing the cross-section of the structure. Referring to FIG. 14, in subsequent processes, one or more interlayer dielectric layers 1060 may be formed over the transistor structure 90T depicted in the above embodiments, and interconnecting structures 1070 including metal vias 1072 and metal lines 1074 may be formed and electrically connected with the contact terminals 1020 and/or the gate electrode structure 1050 of the transistor structure 90T for further electrical connection. It is understood that multiple levels of interlayer dielectric layers and interconnecting structures may be formed and connected to the transistor structure(s) depicted in all of the above embodiments for electrical connection and interconnection.

It is understood that transistor structure 90T may be further electrically connected with the underlying active device(s) and/or components through the interconnecting structures 1070 and the metallization structures within the substrate 1000, although no detailed description is provided or depicted in the drawings.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the illustrated embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during middle-of-line processes.

In the embodiments, as the channel layer is formed in the trench or recess, and the configuration, size or number of the trench(es) or recess(es) may be adjusted, the whole channel area of the semiconductor channel layer can be appropriately modulated. In some embodiments, the relative locations of the trench and the contact openings are finely tuned to minimize extension resistance between the channel layer and the contact terminals to exert better control of short channel effect and enhance the device performance.

In some embodiments of the present disclosure, a semiconductor device is described. The device includes an insulating dielectric layer, a gate structure, source and drain terminals and a channel region. The gate structure is located in the insulating dielectric layer and extends in a first direction. The source and drain terminals are located in the insulating dielectric layer and located respectively at both opposite ends of the gate structure. The source and drain terminals are spaced apart from each other with a first distance along the first direction. The channel region is located in the insulating dielectric layer and is sandwiched between the gate structure and the source and drain terminals. The channel region surrounds sidewalls of the gate structure. The channel region extends between the source and drain terminals with a first length along the first direction, and the first length is no less than the first distance.

In some embodiments of the present disclosure, a semiconductor device is described. The device includes an insulating dielectric layer, a gate structure, source and drain terminals and a channel region. The gate structure is embedded in the insulating dielectric layer and extends in a first direction. The gate structure includes a gate electrode and a gate dielectric layer surrounding the gate electrode. The source and drain terminals are embedded in the insulating dielectric layer and located respectively at opposite ends of the gate structure. The source and drain terminals are spaced apart from each other with a first distance along the first direction. The channel region is embedded in the insulating dielectric layer and located between the gate structure and the source and drain terminals. The channel region wraps around the gate dielectric layer surrounding the gate electrode, and the channel region extends between the source and drain terminals with a first length along the first direction. The first length is substantially the same as or larger than the first distance.

In some embodiments of the present disclosure, a method for forming a semiconductor device is described. At least two contact openings are formed in an insulating dielectric layer. Contact terminals are filled in the at least two contact openings. A trench is formed in the insulating dielectric layer between the at least two contact openings exposing the contact terminals. A channel layer is formed over the trench covering sidewalls and a bottom surface of the trench and covering the exposed contact terminals. A gate structure is formed on the channel layer within the trench filling up the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
an insulating dielectric layer;
a gate structure, located in the insulating dielectric layer and extending in a first direction;
source and drain terminals, located in the insulating dielectric layer and located respectively at both opposite ends of the gate structure; and
a channel region, located in the insulating dielectric layer and sandwiched between the gate structure and the source and drain terminals and surrounding sidewalls of the gate structure, wherein the channel region extends between the source and drain terminals.

2. The semiconductor device of claim 1, wherein the channel region includes an amorphous semiconductor material.

3. The semiconductor device of claim 1, wherein the source and drain terminals are spaced apart from each other with a first distance along the first direction, the channel region extends between the source and drain terminals with a first length along the first direction, and the first length is no less than the first distance.

4. The semiconductor device of claim 3, wherein the first length is substantially the same as the first distance, and the channel layer is in contact with side sidewalls of the source and drain terminals and extends between the facing sidewalls of the source and drain terminals.

5. The semiconductor device of claim 3, wherein the first length is larger than the first distance, and the channel layer extends beyond side sidewalls of the source and drain terminals and extends into the source and drain terminals.

6. The semiconductor device of claim 1, wherein the channel region extends over and covers at least four lateral side surfaces of the gate structure and has a span width in a second direction substantially the same as a dimension of one of the source and drain terminals in the second direction, and the second direction is perpendicular to the first direction.

7. The semiconductor device of claim 1, wherein the channel region extends over and covers at least four lateral side surfaces of the gate structure and has a span width in a second direction smaller than a dimension of one of the source and drain terminals in the second direction, and the second direction is perpendicular to the first direction.

8. The semiconductor device of claim 1, wherein the channel region extends from a surface of the insulating dielectric layer into the insulating dielectric layer with a first depth along a thickness direction and the source and drain terminals extend into the insulating dielectric layer with a second depth along the thickness direction, the second depth is substantially equivalent to the first depth, and the thickness direction is perpendicular to the first direction.

9. The semiconductor device of claim 1, wherein the channel region extends from a surface of the insulating dielectric layer into the insulating dielectric layer with a first depth along a thickness direction and the source and drain terminals extend into the insulating dielectric layer with a second depth along the thickness direction, the second depth is smaller than the first depth, and the thickness direction is perpendicular to the first direction.

10. The semiconductor device of claim 1, wherein the channel region extends from a surface of the insulating dielectric layer into the insulating dielectric layer with a first depth along a thickness direction and the source and drain terminals extend into the insulating dielectric layer with a second depth along the thickness direction, the second depth is larger than the first depth, and the thickness direction is perpendicular to the first direction.

11. A semiconductor device, comprising:
a gate structure, embedded in an insulating dielectric layer and extending in a first direction, wherein the gate structure includes a gate electrode and a gate dielectric layer surrounding the gate electrode;
source and drain terminals, embedded in the insulating dielectric layer and located respectively at opposite ends of the gate structure; and
a channel region, embedded in the insulating dielectric layer and located between the gate structure and the source and drain terminals, wherein the channel region wraps around the gate dielectric layer surrounding the gate electrode, and the channel region extends between the source and drain terminals.

12. The semiconductor device of claim 11, wherein the source and drain terminals are spaced apart from each other with a first distance along the first direction, and the channel region extends between the source and drain terminals with a first length along the first direction, and the first length is substantially the same as or larger than the first distance.

13. The semiconductor device of claim 11, wherein the gate dielectric layer cover four lateral side surfaces and a bottom surface of the gate electrode, the gate dielectric layer is fully covered by the channel region, and the gate dielectric layer is isolated from the insulating dielectric layer by the channel region.

14. The semiconductor device of claim 11, wherein the gate dielectric layer cover four lateral side surfaces and a bottom surface of the gate electrode, four lateral side surfaces of the gate dielectric layer is covered by the channel region with a bottom surface of the gate dielectric layer exposed by the channel region, and the bottom surface of the gate dielectric layer is in contact with the insulating dielectric layer.

15. The semiconductor device of claim 11, wherein the channel region is in direct contact with the source and drain terminals.

16. A method of manufacturing a semiconductor device, comprising:
forming at least two contact openings in an insulating dielectric layer;
forming contact terminals filling up the at least two contact openings;
forming a trench in the insulating dielectric layer between the at least two contact openings exposing the contact terminals;
forming a channel layer over the trench covering sidewalls and a bottom surface of the trench and covering the exposed contact terminals; and
forming a gate structure on the channel layer within the trench filling up the trench.

17. The method of claim 16, wherein the trench is formed by removing the insulating dielectric layer between the at least two contact openings to expose sidewalls of the contact terminals.

18. The method of claim 16, wherein the trench is formed by removing the insulating dielectric layer between the at least two contact openings and removing portions of the contact terminals.

19. The method of claim 16, wherein the at least two contact openings are formed by performing a first etching process to etch the insulating dielectric layer to a first depth, and the trench is formed by performing a second etching process to etch the insulating dielectric layer to a second depth larger than the first depth.

20. The method of claim 16, wherein the at least two contact openings are formed by performing a first etching process to etch the insulating dielectric layer to a first depth, and the trench is formed by performing a second etching process to etch the insulating dielectric layer to a second depth substantially the same as the first depth.

* * * * *